US009788412B2

(12) United States Patent
Klingemann et al.

(10) Patent No.: US 9,788,412 B2
(45) Date of Patent: Oct. 10, 2017

(54) TECHNIQUES AND ARRANGEMENTS FOR MULTIPLE COMPONENT GROUNDING (71) Applicant: Trane International Inc., Piscataway, NJ (US)

(72) Inventors: Steven K. Klingemann, West Salem, WI (US); Alejandro Jimenez, Maple Grove, MN (US)

(73) Assignee: Trane International Inc., Piscataway, NJ (US)

( * ) Notice: Subject to any disclaimer, the term of this patent is extended or adjusted under 35 U.S.C. 154(b) by 20 days.

(21) Appl. No.: 14/726,263

(22) Filed: May 29, 2015

(65) Prior Publication Data

US 2015/0382449 A1 Dec. 31, 2015
US 2016/0295687 A9 Oct. 6, 2016

Related U.S. Application Data

(63) Continuation of application No. PCT/US2013/072061, filed on Nov. 26, 2013.

(60) Provisional application No. 61/732,260, filed on Nov. 30, 2012.

(51) Int. Cl.
*G02F 1/1333* (2006.01)
*H05K 1/02* (2006.01)
*H05K 1/14* (2006.01)
*H05K 3/36* (2006.01)

(52) U.S. Cl.
CPC ..... *H05K 1/0215* (2013.01); *G02F 1/133308* (2013.01); *H05K 1/144* (2013.01); *H05K 3/368* (2013.01); *G02F 2001/133334* (2013.01); *H05K 2201/042* (2013.01)

(58) Field of Classification Search
CPC ............ G02F 1/133308; H05K 1/0215; H05K 1/144; H05K 3/36; H05K 3/368
USPC .......................................................... 349/58
See application file for complete search history.

(56) References Cited

U.S. PATENT DOCUMENTS

2005/0052853 A1 3/2005 Hsu et al.
2006/0146486 A1 7/2006 Wikstrom et al.
2009/0247237 A1* 10/2009 Mittleman ............ H04M 1/026
455/567

(Continued)

OTHER PUBLICATIONS

International Search Report and Written Opinion, International Patent Application No. PCT/US2013/072061, Apr. 14, 2014, 8 pages.

*Primary Examiner* — Thanh-Nhan P Nguyen
(74) *Attorney, Agent, or Firm* — Taft Stettinius & Hollister LLP (57) ABSTRACT

Techniques and arrangements for forming ground bonds between a plurality of components are provided. In one form, a grounding arrangement includes a first circuit board including a first ground plane and a flange member electrically coupled to the first ground plane. The arrangement also includes a second circuit board including a second ground plane, and a polymeric member including an electrically conductive coating. The polymeric member forms a bond between the first ground plane, the flange member, and the second ground plane. In one particular but non-limiting aspect of this form, the grounding arrangement is utilized in a human machine interface having a liquid crystal display. Further embodiments, forms, objects, features, advantages, aspects, and benefits shall become apparent from the description and drawings.

19 Claims, 11 Drawing Sheets

(56) References Cited

U.S. PATENT DOCUMENTS

2010/0140777 A1  6/2010  Michaels et al.
2012/0153472 A1* 6/2012  Pagaila ................ H01L 21/568
                                              257/738

* cited by examiner

TECHNIQUES AND ARRANGEMENTS FOR MULTIPLE COMPONENT GROUNDING

CROSS-REFERENCE TO RELATED APPLICATIONS

The present Patent Cooperation Treaty patent application claims the benefit of U.S. Provisional Patent Application No. 61/732,260, filed on Nov. 30, 2012, which is hereby incorporated by reference in its entirety.

BACKGROUND

The present application relates to techniques and arrangements for forming ground bonds between a plurality of components, and more particularly but not exclusively, to a grounding arrangement for components of a human machine interface.

In a variety of different applications it may be desirable to form a common ground bond between a plurality of different components. In the case of printed circuit boards for example, this common ground bond may be formed by utilizing a soldered connection that electrically couples ground planes of separate circuit boards. Amongst other things, a soldered connection of this nature may be time consuming and difficult to achieve, and it is also a potential source for future failure of the ground bound. In addition, utilizing a soldered connection to electrically couple ground planes of separate circuit boards provides little to no shielding of the circuit boards from electromagnetic interference which can disrupt functionality of the board circuitry. Similarly, electromagnetic interference shields that are separate and distinct from any means connecting ground planes of circuit boards are often necessary. In view of the foregoing, there is a demand for further improvements in this area of technology.

SUMMARY

Techniques and arrangements for forming electrical ground bonds between a plurality of components are provided. In one form, a grounding arrangement includes a first circuit board including a first ground plane and a flange member electrically coupled to the first ground plane. The arrangement also includes a second circuit board including a second ground plane, and a polymeric member including an electrically conductive coating. The polymeric member forms an electrically conductive bond between the first ground plane, the flange member, and the second ground plane. In one particular but non-limiting aspect of this form, the grounding arrangement is utilized in a human machine interface having a liquid crystal display.

In one embodiment, a human machine interface includes a display module including a first circuit board. The first circuit board includes a first ground plane, and a bezel extends around at least a portion of the first circuit board. The human machine interface also includes a retaining member configured to be positioned in contact with the bezel and including an electrically conductive coating, and a second circuit board configured to engage with the retaining member and including a second ground plane. The first ground plane of the first circuit board, the bezel and the second ground plane of the second circuit board are conductively bonded together when the retaining member is engaged with the display module and the second circuit board is engaged with the retaining member.

In one form of this embodiment, the display module further includes a liquid crystal display. In another form, the retaining member is formed from a polymeric material and the electrically conductive coating is positioned over the polymeric material. In yet another form, the human machine interface further includes a first outer member configured to receive the display module and engage with the retaining member. In one aspect of this form, the human machine interface further includes a second outer member configured to engage with the first outer member. In yet another form of this embodiment, the bezel is formed of an electrically conductive material. In still another form, the first ground plane of the first circuit board includes a number of contact pads and the bezel includes a number of tabs electrically coupled to the contact pads. In another form, the electrically conductive coating is a silver-coated copper conductive coating. In yet another form, the second circuit board includes a plurality of openings and the retaining member includes a plurality of posts configured to engage with the plurality of openings of the second circuit board. In one aspect of this form, the second ground plane of the second circuit boards includes a plurality of contacts pads at least partially surrounding the plurality of openings. In another form, the bezel is electrically coupled to the first ground plane of the first circuit board.

In another embodiment, a method includes providing a first circuit board including a first ground plane; electrically coupling a bezel positioned around at least a portion the first circuit board to the first ground plane; providing a second circuit board including a second ground plane; and positioning a polymeric member between the first circuit board and the second circuit board, the positioning including forming a conductive bond between the first ground plane, the second ground plane and the bezel.

In one form of this embodiment, the polymeric member includes an electrically conductive coating material. In one aspect of this form, the electrically conductive coating material is a silver-coated copper conductive coating. In yet another form, the first circuit board is a component of a display module. In still another form, positioning the polymeric member between the first circuit board and the second circuit board further includes engaging the polymeric member with an outer housing member and a plurality of posts extending from the bezel, and engaging the second circuit board with the polymeric member.

In still another embodiment, a grounding arrangement includes a first circuit board including a first ground plane; a flange member electrically coupled to the first ground plane; a second circuit board including a second ground plane; and a polymeric member including an electrically conductive coating, the polymeric member forming a bond between the first ground plane, the flange member, and the second ground plane.

In one form of this embodiment, the flange member is formed of an electrically conductive material. In another form, the first circuit board is a component of a display module, and the grounding arrangement further includes an external housing member configured to receive the display module and engage with the polymeric member to retain the display module in the external housing member.

Other aspects include unique methods, systems, devices, kits, assemblies, equipment, and/or apparatus related to forming ground bonds between a plurality of components.

Further aspects, embodiments, forms, features, benefits, objects, and advantages shall become apparent from the detailed description and figures provided herewith.

BRIEF DESCRIPTION OF THE FIGURES

The description herein makes reference to the accompanying figures wherein like reference numerals refer to like parts throughout the several views, and wherein.

DETAILED DESCRIPTION OF REPRESENTATIVE EMBODIMENTS

For purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Techniques and arrangements for forming electrically conductive bonds between a plurality of components are provided. In one form, a grounding arrangement includes a first circuit board including a first ground plane and a flange member electrically coupled to the first ground plane. The arrangement also includes a second circuit board including a second ground plane, and a polymeric member including an electrically conductive coating. The polymeric member forms a bond between the first ground plane, the flange member, and the second ground plane. It should be understood that the grounding arrangement described above and in greater detail below may be used in a variety of different applications. Similarly, while this type of grounding arrangement is described in further detail in connection with the human machine interface 10 illustrated in FIGS. 1 and 2 for example, it should be understood that implementation of the same in other devices, systems and applications is possible.

Figure 1:
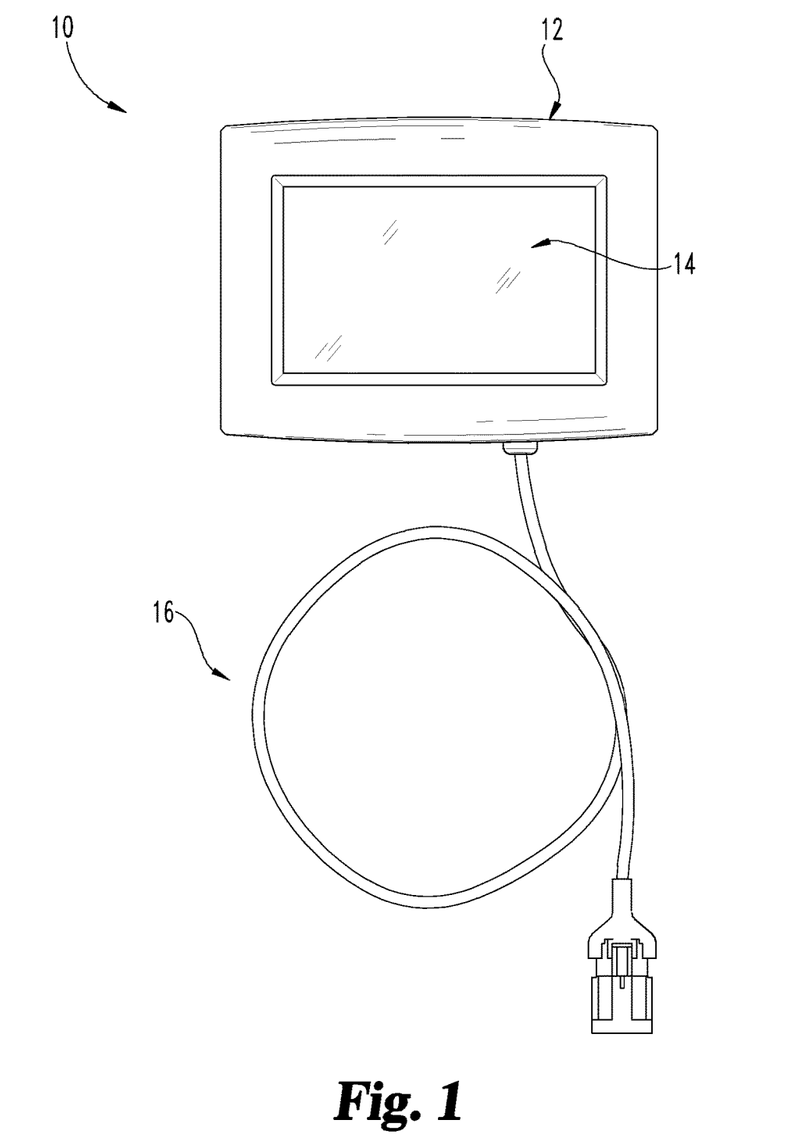
FIG. 1 is a front plan view of an exemplary human machine interface.
Figure 2:
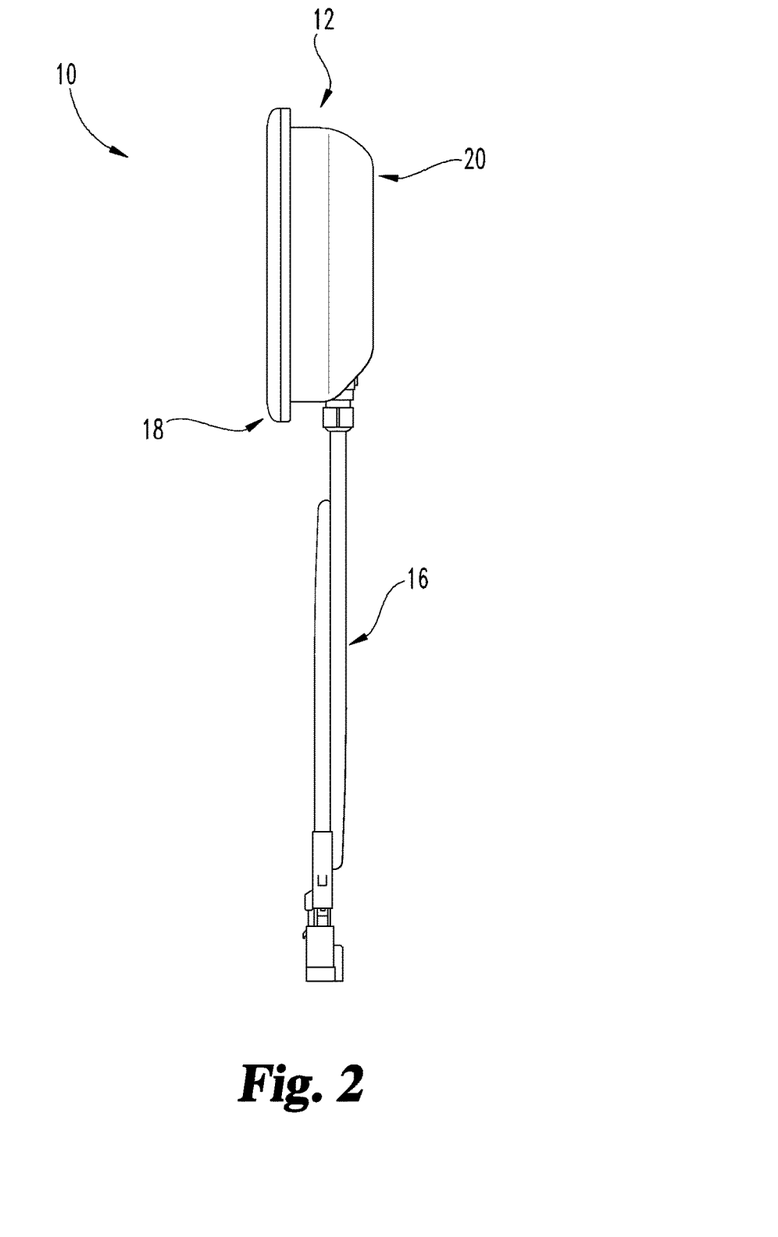
FIG. 2 is a side plan view of the human machine interface of FIG. 1.

Turning now to FIGS. 1 and 2, a human machine interface (HMI) 10 is illustrated in front and side plan views, respectively. It shall be understood that HMI 10 may be configured as a display, configured as a user input device such as a touch screen, or configured to perform both functions. HMI 10 includes an external housing 12, a display 14, and a cord 16 configured to engage with a controller or other componentry of an apparatus, machine, device or system, for example, to allow a user to control and/or define one or more operating aspects of the apparatus, machine, device or system through HMI 10. In one particular but non-limiting configuration, HMI 10 is structured to allow a user to control and/or define one or more operating aspects of an air conditioning, refrigeration or chiller system. In one form, display 14 is a touch screen that allows a user to interact with HMI 10 by direct contact with display 14. In other forms, HMI 10 may additionally or alternatively include a plurality of push-button input devices, a keyboard, mouse or other pointing device, touch pad, or roller ball. In one particular form, display 14 is an operator display that is of a liquid crystal display (LCD) type, although other types of operator displays are contemplated. As best illustrated in FIG. 2 for example, external housing 12 includes a first member 18 and a second member 20 configured to engage with first member 18.

Figure 3:
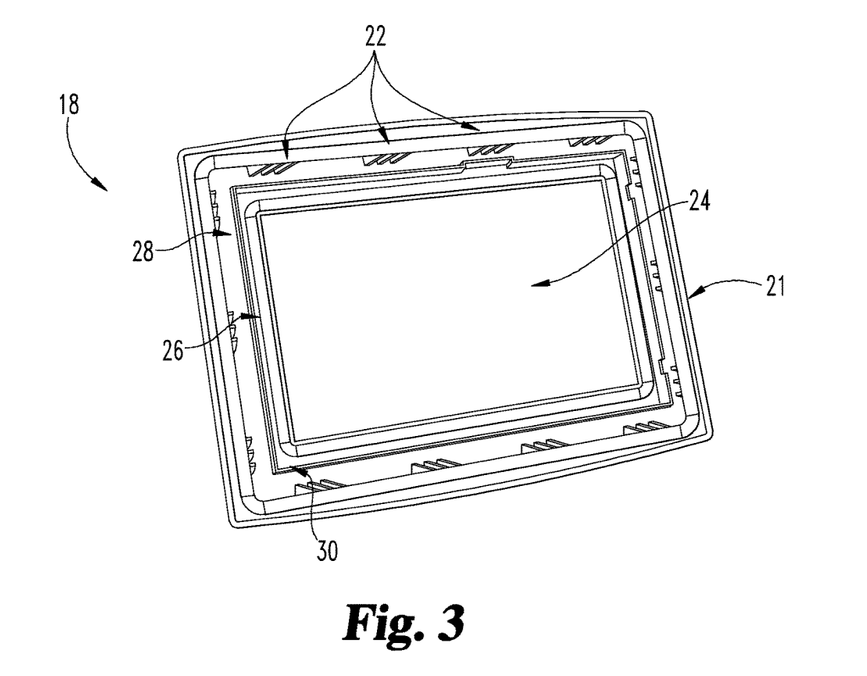
FIG. 3 is a perspective view of an exterior housing member of the human machine interface of FIG. 1.

As illustrated in FIG. 3 for example, first member 18 includes a raised lip or rim 21 extending about its periphery, and a plurality of retaining clips or tabs 22, only a few of which have been identified for the sake of clarity. First member 18 also includes an opening 24 configured to facilitate access to and/or viewing of display 14. In one form, a clear cover may extend over opening 24 to protect display 14 from damage, although forms in which any such cover is not present are also possible. A seal 26 extends around opening 24 and is configured to engage with a portion of display module 32 (FIG. 4) in order prevent water or other contaminants from entering HMI 10. A raised lip or rim 28 also extends around opening 24 and seal 26 and forms a receptacle 30 configured to receive display module 32 such that display 14 is centered or otherwise appropriately positioned relative to opening 24. While not illustrated, it should be understood that seal 26 may be formed of an adhesive material and/or that an adhesive material may be positioned in receptacle 30 in order to secure or assist in securing display module 32 in receptacle 30.

Figure 4:
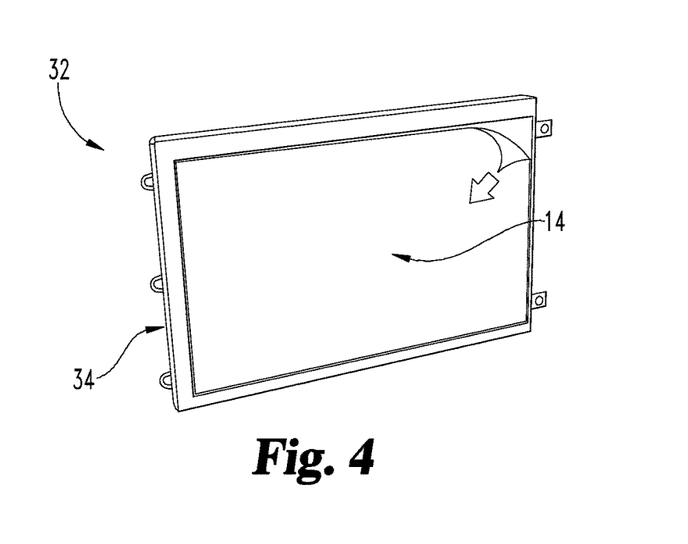
FIG. 4 is a perspective view of a display module of the human machine interface of FIG. 1.
Figure 5:
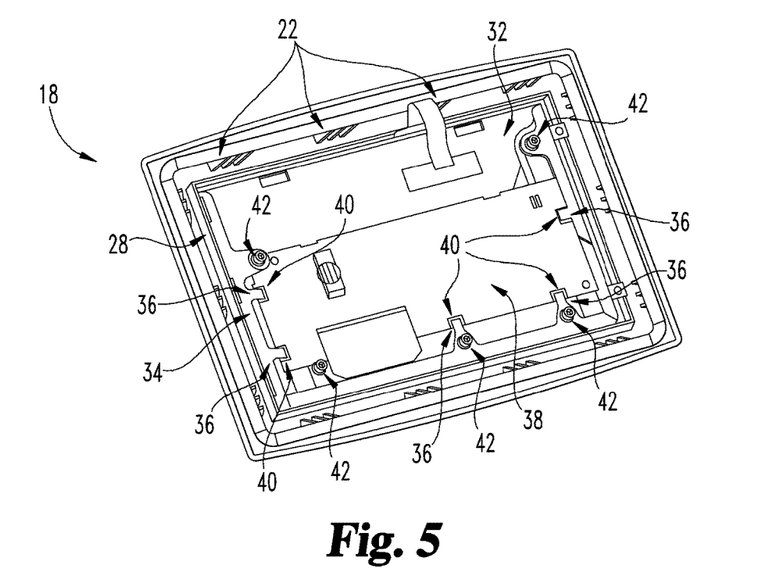
FIG. 5 is a perspective view of the display module of FIG. 4 positioned in the exterior housing member of FIG. 3.

Referring now to FIGS. 4 and 5, display module 32 includes a flange member or bezel 34 extending around display 14. As best seen in FIG. 5 for example where display module 32 is positioned in receptacle 30, bezel 34 also extends around a portion of a circuit board 38. In one form, bezel 34 is formed of an electrically conductive material such as a metal or metal alloy, although forms in which bezel 34 is formed of a polymeric material and then coated with an electrically conductive coating material (non-limiting examples of which are provided below) are also contemplated. Circuit board 38 includes a ground plane having a plurality of contact pads 40 which are electrically coupled to inwardly extending tabs 36 of bezel 34 such that the ground plane of circuit board 38 is bonded to bezel 34. In one non-limiting form for example, tabs 36 of bezel 34 may be soldered to contact pads 40. Bezel 34 also includes a plurality of studs or posts 42 extending away from circuit board 38.

Figure 6:
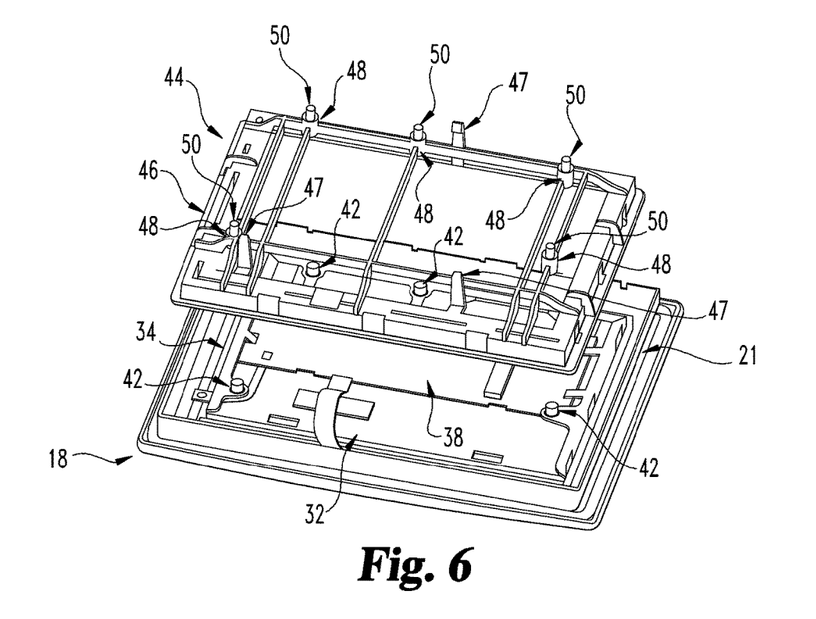
FIG. 6 is a perspective, assembly view of a retaining member positioned relative to the display module and exterior housing member illustrated in FIG. 5.
Figure 7:
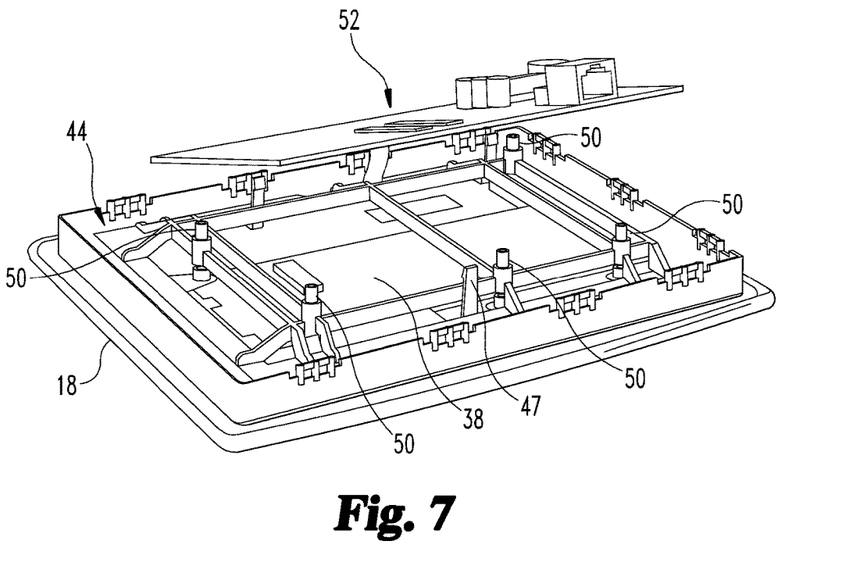
FIG. 7 is a perspective, assembly view of a circuit board positioned relative to the retaining member illustrated in FIG. 6.

In addition to any adhesive material (if present), display module 32 is retained in receptacle 30 by a retaining member 44, further details of which will be provided in connection with FIG. 6. Retaining member 44 includes a base portion 46 configured to be positioned within rim 21 of first member 18 and engage with retaining clips 22. Retaining member 44 also includes a plurality of latching members 47 and a plurality of coupling portions 48 that each includes a receptacle configured to receive at least a portion of a respective post 42 of bezel 34. Each of the plurality of coupling portions 48 also includes a stud or post 50 positioned opposite of the receptacle. The posts 50 have a reduced diameter relative to the underlying portion of coupling portions 48 such that a radial lip or rim extends around the base of posts 50. When retaining member 44 is engaged with first member 18, posts 42 of bezel 34 are received in the receptacles of coupling portions 48. In one form, retaining member 44 is formed of a polymeric material to which a coating of electrically conductive material is sprayed or applied. One non-limiting type of electrically conductive coating that may be applied to retaining member 44 is a silver-coated copper conductive coating, non-limiting forms of which are commercially available from Spraylat Electronic Materials Group (Mount Vernon, N.Y.). In one form, application of the electrically conductive coating is limited to each of the coupling portions 48 such that posts 42 are in contact with an electrically conductive coating that extends along the length of coupling portions 48, including posts 50, when retaining member 44 is engaged with first member 18. In this arrangement, the electrically conductive coating on retaining member 44 becomes bonded with bezel 34 and the ground plane of circuit board 38 when retaining member 44 is engaged with first member 18. In other forms, all or substantially all of the remaining portions of retaining member 44 are also coated with the electrically conductive material, which may also exhibit electromagnetic interference shielding properties. Similarly, in these forms where all or substantially all of retaining member 44 is covered by the electrically conductive coating, retaining member 44 shields or increases shielding of various components of HMI 10 in order to reduce or prevent electromagnetic interference with the same.

Figure 8:
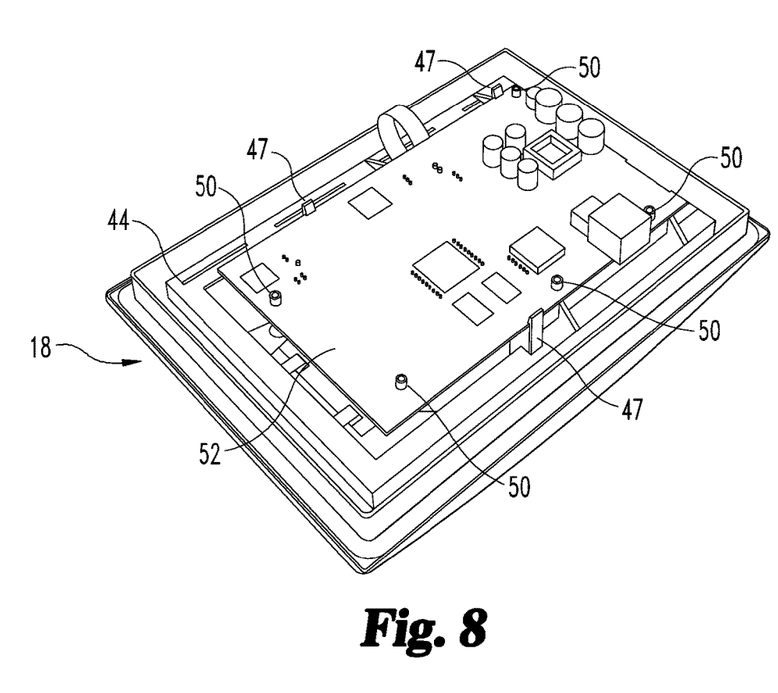
FIG. 8 is a perspective view of the circuit board illustrated in FIG. 7 engaged with the retaining member.

HMI 10 further includes a circuit board 52 that includes a plurality of openings configured to receive at least a portion of posts 50 of coupling portions 48. As illustrated in FIG. 8 for example, engagement of circuit board 52 with retaining member 44 is maintained by latching members 47 which engage with a surface of circuit board 52 when it is positioned on posts 50. When engaged with retaining member 44, circuit board 32 is spaced apart from display module 32 and circuit board 38 by retaining member 44. Circuit board 52 also includes a ground plane having a plurality of contact pads positioned around the openings in which posts 50 are positioned. Similarly, when circuit board 52 is engaged with retaining member 44 and positioned on posts 50 as illustrated in FIG. 8 for example, the contact pads positioned around the openings are placed in contact with the electrically conductive coating positioned on the radial lip or rim that extends around the base of posts 50. As a result, the ground plane of circuit board 52 becomes bonded with the electrically conductive coating of retaining member 44. Further, given the electrical coupling or bonding described above between the electrically conductive coating of retaining member 44, bezel 34 and the ground plane of circuit board 38, it should be understood that the ground plane of circuit board 38, bezel 34 and the ground plane of circuit board 52 are bonded together when HMI 10 is assembled as illustrated in FIG. 8; i.e., with retaining member 44 positioned between and engaged with circuit boards 38 and 52. In this configuration, the electrically conductive coating on retaining member 44 facilitates bonding between these components despite retaining member 44 being formed of a polymeric material. Retaining member 44 also eliminates the need to utilize more complex and failure susceptible electrical connection techniques such as soldering to bond the ground plane of circuit board 38, bezel 34 and the ground plane of circuit board 52. Moreover, as indicated above, the electrically conductive coating on retaining member 44 may also exhibit electromagnetic interference shielding properties such that retaining member 44 shields or increases shielding of various components of HMI 10 in order to reduce or prevent electromagnetic interference with the same.

Figure 9:
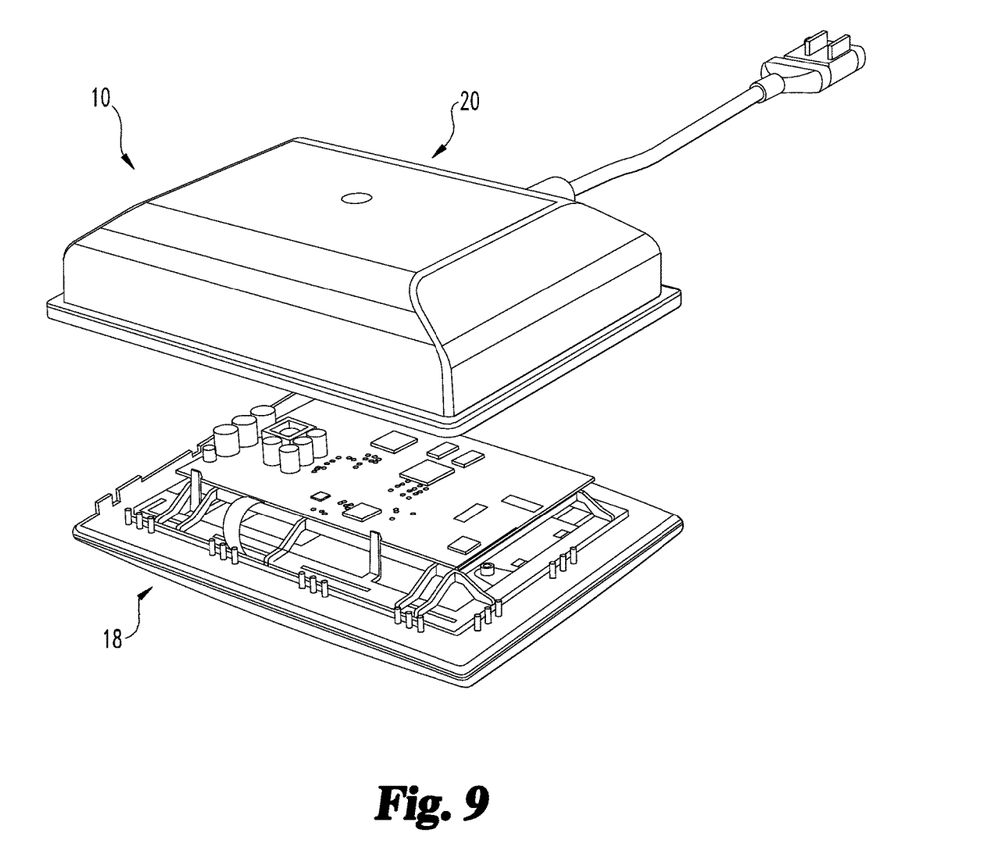
FIG. 9 is a perspective, assembly view illustrating engagement of a second exterior housing member with the exterior housing member illustrated in FIG. 3.

Following assembly of the above-described components to the configuration illustrated in FIG. 8, external housing 12 may be closed by engaging first and second members 18 and 20 as illustrated in FIG. 9 in order to protect these components. More particularly, retaining tabs 22 of first member 18 engage with second member 20 in order to maintain engagement of first and second members 18 and 20.

Figure 10:
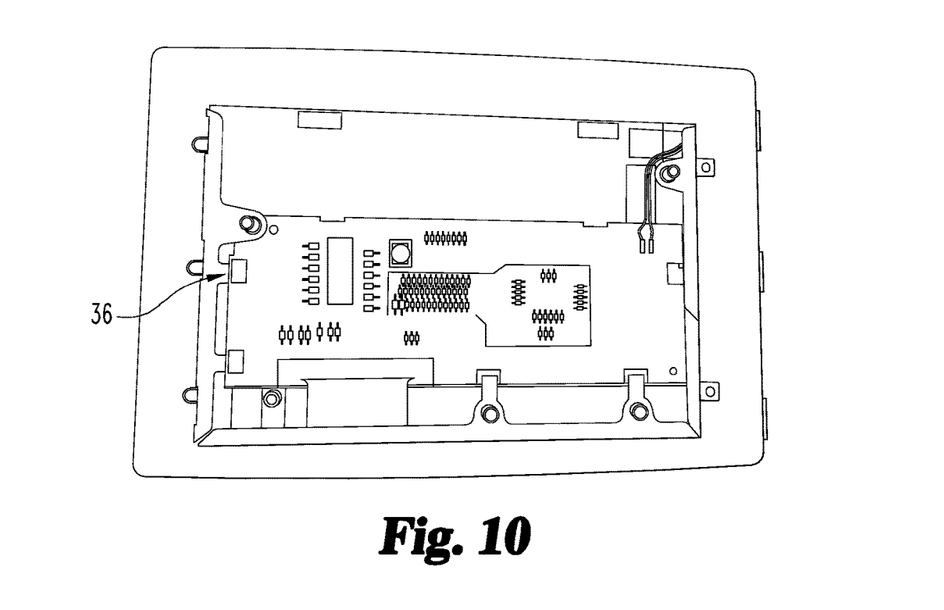
FIGS. 10-13 are photographic images illustrating various aspects of the human machine interface of FIG. 1.
Figure 11:
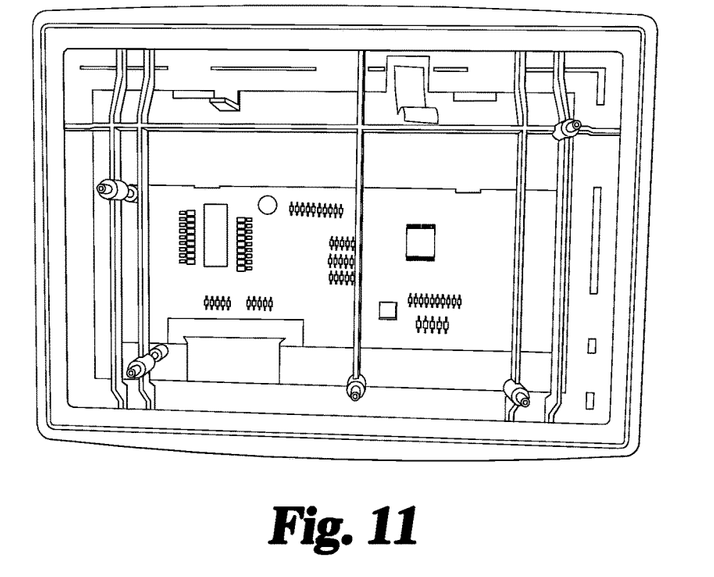
Figure 12:
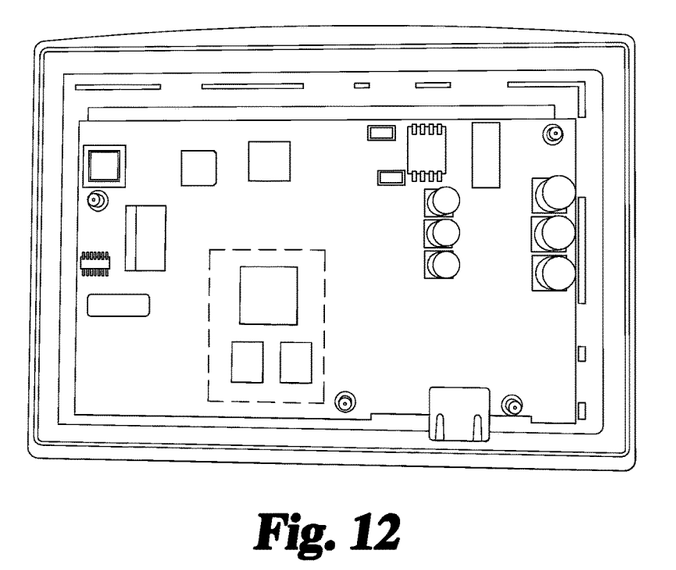
Figure 13:
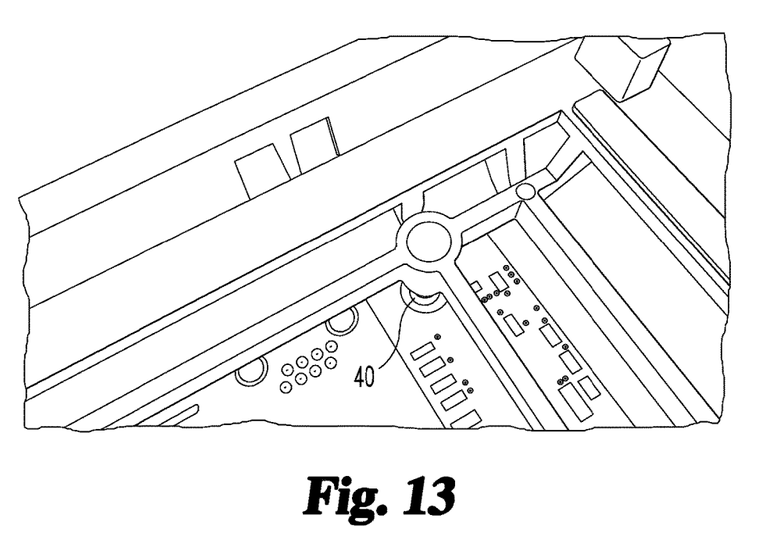

FIGS. 10-13 are photographic images illustrating various details of the ground bonding arrangement described above in connection with FIGS. 1-9. FIG. 10 illustrates a front enclosure and LCD assembly that includes a metal bezel. FIG. 10 also illustrates five tabs 36 from the metal bezel soldered to the LCD circuit board providing ground bonding between the circuit board and the bezel. FIG. 11 illustrates the HMI 10 with the retainer installed. In addition, there is a conductive coating on the retainer that provides a ground bond between the retainer and the LCD assembly. FIG. 12 illustrates the HMI 10 with the main circuit board installed. FIG. 12 also illustrates five gold pads 40 that provide ground bonding between the main circuit board and retainer. FIG. 13 illustrates detail of a gold pad on the main circuit board. FIG. 13 also illustrates that when installed, the pad 40 is in contact with the conductive coating on the retainer.

It should be appreciated that assembly of the components of HMI 10 may be performed in a sequence that varies from that described above. For example, circuit board 52 may be engaged with retaining member 44 before retaining member 44 is engaged with display module 32 and first member 18. As another example, circuit board 52, retaining member 44 and display module 32 may be engaged together before display module 32 and retaining member 44 are positioned relative to first member 18. It should also be understood that the grounding techniques and arrangements described herein may be used in applications other than human machine interfaces. For example, it is contemplated that such grounding arrangements may be utilized in applications that include a display screen and multiple circuit boards but are not configured to interface with any apparatus, machine, device or system. It is also contemplated that the grounding arrangement described herein could be used in applications where two separate circuit boards are present but a display is not necessarily present. In such forms for example, a polymeric material coated with an electrically conductive material could bond ground planes of separate circuit boards by being positioned in contact with contact pads of the separate ground planes.

One aspect of the present application includes a human machine interface, comprising: a display module including a first circuit board including a first ground plane, and a bezel extending around at least a portion of the first circuit board; a retaining member configured to engage with the display module and including an electrically conductive coating; and a second circuit board configured to engage with the retaining member and including a second ground plane; wherein the first ground plane of the first circuit board, the bezel and the second ground plane of the second circuit board are electrically bonded together when the retaining member is engaged with the display module and the second circuit board is engaged with the retaining member.

Features of the aspect of the present application may include: wherein the display module further includes a liquid crystal display; wherein the retaining member is formed from a polymeric material and the electrically conductive coating is positioned over the polymeric material; further comprising a first outer member configured to receive the display module and engage with the retaining member; further comprising a second outer member configured to engage with the first outer member; wherein the bezel is formed of an electrically conductive material; wherein the first ground plane of the first circuit board includes a number of contact pads and the bezel includes a number of tabs electrically coupled to the contact pads; wherein the electrically conductive coating is a silver-coated copper conductive coating; wherein the second circuit board includes a plurality of openings and the retaining member includes a plurality of posts configured to engage with the plurality of openings of the second circuit board; wherein the second ground plane of the second circuit boards includes a plurality of contacts pads at least partially surrounding the plurality of openings; wherein the bezel is electrically coupled to the first ground plane of the first circuit board.

Another aspect of the present application may include a method, comprising: providing a first circuit board including a first ground plane; electrically coupling a bezel positioned around at least a portion the first circuit board to the first ground plane; providing a second circuit board including a second ground plane; and positioning a polymeric member between the first circuit board and the second circuit board, the positioning including forming a bond between the first ground plane, the second ground plane and the bezel with the polymeric member.

Features of the aspect of the present application may include: wherein the polymeric member includes an electrically conductive coating material; wherein the electrically conductive coating material is a silver-coated copper conductive coating; wherein the first circuit board is a component of a display module; wherein positioning the polymeric member between the first circuit board and the second circuit board further includes engaging the polymeric member with an outer housing member and a plurality of posts extending from the bezel, and engaging the second circuit board with the polymeric member.

Yet another aspect of the present application includes an electrical grounding arrangement, comprising: a first circuit board including a first ground plane; a flange member electrically coupled to the first ground plane; a second circuit board including a second ground plane; and a polymeric member including an electrically conductive coating, the polymeric member forming a bond between the first ground plane, the flange member, and the second ground plane.

Features of the aspect of the present application may include: wherein the flange member is formed of an electrically conductive material; wherein the first circuit board is a component of a display module, and further comprising an external housing member configured to receive the display module and engage with the polymeric member to retain the display module in the external housing member.

While the invention has been illustrated and described in detail in the drawings and foregoing description, the same is to be considered as illustrative and not restrictive in character, it being understood that only certain embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A human machine interface, comprising:
    a display module including a first circuit board including a first ground plane, and a bezel extending around at least a portion of the first circuit board;
    a retaining member configured to engage with the display module and including an electrically conductive coating; and
    a second circuit board configured to engage with the retaining member and including a
second ground plane;
    wherein the first ground plane of the first circuit board, the bezel and the second ground plane of the second circuit board are electrically bonded together when the retaining member is engaged with the display module and the first and second circuit boards are engaged with the retaining member, and wherein the retaining member is disposed between the first circuit board and the second circuit board.

2. The human machine interface of claim 1, wherein the display module further includes a liquid crystal display.

3. The human machine interface of claim 1, wherein the retaining member is formed from a polymeric material and the electrically conductive coating is positioned over the polymeric material.

4. The human machine interface of claim 1, further comprising a first outer member configured to receive the display module and engage with the retaining member.

5. The human machine interface of claim 4, further comprising a second outer member configured to engage with the first outer member.

6. The human machine interface of claim 1, wherein the bezel is formed of an electrically conductive material.

7. The human machine interface of claim 1, wherein the first ground plane of the first circuit board includes a number of contact pads and the bezel includes a number of tabs electrically coupled to the contact pads.

8. The human machine interface of claim 1, wherein the electrically conductive coating is a silver-coated copper conductive coating.

9. The human machine interface of claim 1, wherein the second circuit board includes a plurality of openings and the retaining member includes a plurality of posts configured to engage with the plurality of openings of the second circuit board.

10. The human machine interface of claim 9, wherein the second ground plane of the second circuit boards includes a plurality of contacts pads at least partially surrounding the plurality of openings.

11. The human machine interface of claim 1, wherein the bezel is electrically coupled to the first ground plane of the first circuit board.

12. A method, comprising:
    providing a first circuit board including a first ground plane;

electrically coupling a bezel positioned around at least a portion the first circuit board to the first ground plane;

providing a second circuit board including a second ground plane; and positioning a polymeric member between the first circuit board and the second circuit board, the positioning including forming a bond between the first ground plane, the second ground plane and the bezel with the polymeric member.

13. The method of claim 12, wherein the polymeric member includes an electrically conductive coating material.

14. The method of claim 13, wherein the electrically conductive coating material is a silver-coated copper conductive coating.

15. The method of claim 12, wherein the first circuit board is a component of a display module.

16. The method of claim 12, wherein positioning the polymeric member between the first circuit board and the second circuit board further includes engaging the polymeric member with an outer housing member and a plurality of posts extending from the bezel, and engaging the second circuit board with the polymeric member.

17. An electrical grounding arrangement, comprising: a first circuit board including a first ground plane;

a flange member electrically coupled to the first ground plane;

a second circuit board including a second ground plane; and a polymeric member including an electrically conductive coating, the polymeric member forming a bond between the first ground plane, the flange member, and the second ground plane, and wherein the polymeric member is positioned intermediate the first ground plane and the second ground plane.

18. The electrical grounding arrangement of claim 17, wherein the flange member is formed of an electrically conductive material.

19. The electrical grounding arrangement of claim 17, wherein the first circuit board is a component of a display module, and further comprising an external housing member configured to receive the display module and engage with the polymeric member to retain the display module in the external housing member.

* * * * *